United States Patent [19]

Huang

[11] Patent Number: 5,998,287
[45] Date of Patent: Dec. 7, 1999

[54] PROCESS FOR PRODUCING VERY NARROW BURIED BIT LINES FOR NON-VOLATILE MEMORY DEVICES

[75] Inventor: Heng Sheng Huang, Taipei, Taiwan

[73] Assignee: United Microelectronics Corp., Hsinchu, Taiwan

[21] Appl. No.: 08/259,073

[22] Filed: Jun. 13, 1994

[51] Int. Cl.[6] .................. H01L 21/8242; H01L 21/3205; H01L 21/302
[52] U.S. Cl. .......................... 438/587; 438/278; 438/251; 438/253; 438/262; 438/595; 438/738
[58] Field of Search .................. 437/48, 52, 50

[56] References Cited

U.S. PATENT DOCUMENTS

| 4,366,613 | 1/1983 | Ogura et al. .............................. 29/571 |
| 5,075,250 | 12/1991 | Hawkins .................................... 437/52 |
| 5,252,504 | 10/1993 | Lowrey et al. ............................ 437/34 |
| 5,256,587 | 10/1993 | Jun et al. .................................. 437/52 |
| 5,290,723 | 3/1994 | Tani et al. ................................. 437/52 |
| 5,310,693 | 5/1994 | Hsu .......................................... 437/52 |
| 5,318,921 | 6/1994 | Hsue et al. ............................... 437/48 |
| 5,378,646 | 1/1995 | Huang et al. ............................. 437/48 |
| 5,378,649 | 1/1995 | Huang ...................................... 437/48 |

FOREIGN PATENT DOCUMENTS 62-137862  6/1987  Japan .

OTHER PUBLICATIONS

S. Wolf, "Silicon Processing for the VLSIERA", 1986, pp. 285, 286, 290, vol. 1, "Process Technology".

Primary Examiner—John F. Niebling
Assistant Examiner—Ha Tran Nguyen
Attorney, Agent, or Firm—Rabin & Champagne, P.C.

[57] ABSTRACT

An improved process of fabricating a read only memory device (ROM's) wherein the buried N+ lines have desirable very narrow widths and are closely spaced. The process provides that masking stripes are formed with vertical sidewalls and that spacers are formed on the sidewalls. The areas between the spacers are filled in. The spacers are etched away to form narrow closely spaced openings. Ions are implanted through the openings to form closely spaced buried lines.

25 Claims, 4 Drawing Sheets

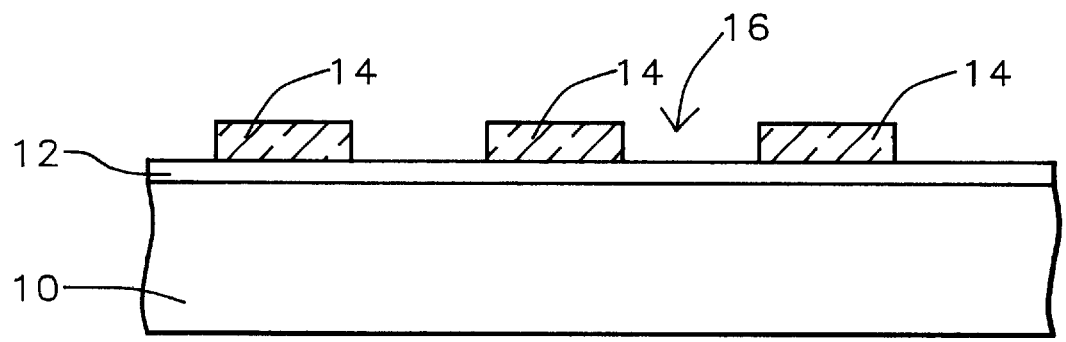
FIG. 1 - Prior Art
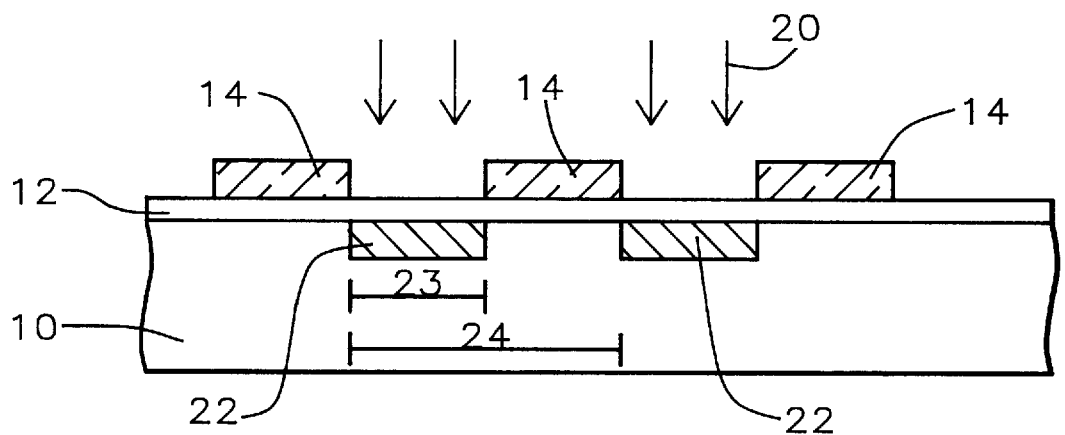
FIG. 2 - Prior Art
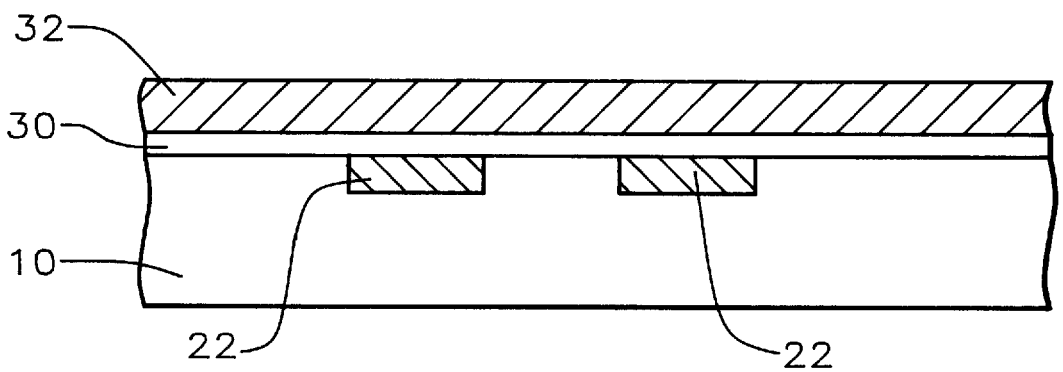
FIG. 3 - Prior Art

PROCESS FOR PRODUCING VERY NARROW BURIED BIT LINES FOR NON-VOLATILE MEMORY DEVICES

BACKGROUND OF INVENTION

1) Field of the Invention

This invention relates to non-volatile memory semiconductor devices and in particular, to an improved process for forming very narrow closely spaced buried bit lines.

2) Description of the Prior Art

In the quest to achieve microminiaturization of integrated circuit devices, individual elements have been made very small and the elements have been closely packed. Microminiaturization increases the speed of operation and reduces the production costs. In order to achieve this, each memory device must occupy less space on the device. Moreover, as read only memory (ROM's) devices are scaled down in size, there is a continuous challenge to produce narrower high density conductive lines (i.e., bit lines). In conventional methods for forming conductive lines, an insulating layer 12, (typically oxide) is deposited on a monocrystalline silicon substrate 10 as shown in FIGS. 1 through 3. Next, a masking layer 14, usually silicon nitride, is deposited on the insulating layer 12. Using conventional photolithography techniques, openings 16 that define the spaced, narrow bit lines are formed in the masking layer 14. Using layer 14 as an implant mask, impurity ions 20 are implanted through the openings 16 into the substrate 10 to form buried bit lines 22. The photolithography resolution capability determines the minimum line pitches 24 and line widths 23. The line pitch is the distance between on side of a line and the same side of an adjacent line. Next, the masking layer is etched away. A thin insulating layer 30, typically thermal oxide, is formed on substrate 10. Subsequently, a conducting layer 32, typically doped polysilicon, is deposited over the insulating layer. The following process steps to complete the read only memory (ROM) device are well known.

A major improvement in microminiaturized device fabrication is disclosed in U.S. Pat. No. 4,366,613. This patent discloses a spacer insulating layer on substantially vertical surfaces on a gate electrode of field effect transistors (FET's). This structure made possible the formation of dopant gradients in source and drain regions.

SUMMARY OF INVENTION

It is a general object of the invention to provide an improved process for fabricating a bit line for a non-volatile memory device.

A more specific object of the present invention is to provide a process of forming non-volatile memory devices with buried bit lines of a smaller size and spacing that is beyond the capability of conventional processes which are limited by the resolution of the photolithographic process.

Another object of the present invention is to provide a process for fabricating read only memory (ROM) devices having very narrow self-aligned buried bit lines.

In accordance with the above objects, a process for fabricating a nonvolatile memory device on a monocrystalline substrate with high density buried bit lines is provided. A first thin insulating layer is formed on the surface of a monocrystalline semiconductor substrate. Then, a foundation layer is deposited over the first insulating layer. Next, a blanket masking layer is deposited over the foundation layer. Spaced parallel masking stripes having substantially vertical sidewalls are formed in the masking layer using conventional photolithographic and etching processes.

A conformal layer, typically polycrystalline silicon, is deposited over the masking layer, the sidewalls and the exposed foundation layer. Next, the conformal layer is anisotropically etched to form spacers on the vertical masking stripe sidewalls.

A glass layer is deposited over the masking stripes. Next, the glass layer is planar etched to expose the top surfaces of the masking stripes and spacers. Following this, the spacers are etched away to form narrow openings which define the bit line locations.

Impurity ions are implanted into the substrate through the narrow openings forming buried lines. Next, the substrate is etched to remove all the previously deposited layers. A thermal gate oxide and polycrystalline silicon layer are deposited on the substrate. Lastly, non-volatile memory devices are formed using conventional semiconductor fabrication techniques,

BRIEF DESCRIPTION OF THE DRAWINGS

The drawings show the following:

FIGS. 1 through 3 are a sequence of cross-sectional views in broken section in greatly enlarged scale that illustrate a process for forming bit lines in a substrate at various stages of fabrication in accordance with the prior art.

DETAILED DESCRIPTION OF THE PREFERRED EMBODIMENTS

The present inventions will be described in detail with reference to the accompanying drawings. It should be noted that the drawings are in greatly simplified form. In practice the memory device structure will be one of many supported on a common substrate connected with suitable metallurgy in various electronic circuit configurations. The substrate shall be a monocrystalline silicon semiconductor body with many devices fabricated therein, as is well known in the art. The substrate 40 is preferable formed of monocrystalline silicon having a surface plane with a crystalline orientation of <1 0 0>.

Figure 4:
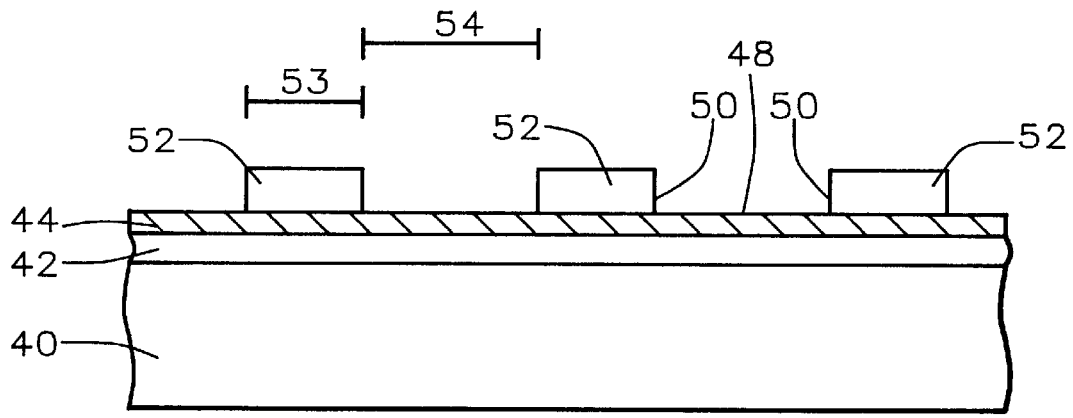
FIGS. 4 through 10 are a sequence of cross-sectional views in broken section in greatly enlarged scale that illustrate buried bit lines in a substrate at various stages of fabrication in accordance with the process of the invention.

As shown in FIG. 4, first insulating layer 42, preferably of thermal silicon oxide, is formed on substrate 40. Layer 42 typically has a thickness in the range of 50 to 400 angstroms, more preferably a thickness of about 100 angstroms.

A foundation layer 44, preferably formed of polycrystalline silicon or silicon nitride, is deposited over layer 42. Layer 44 has a thickness in the range of 100 to 1000 angstroms, more preferably a thickness of typically 200 angstroms.

Next, a relatively thick masking layer, preferably silicon oxide is deposited over layer 44. The masking layer can be any material which can function as an ion implant mask. Suitable materials include silicon oxide, silicon nitride, or borophososilicate glass (BPSG). Silicon oxide can be formed by conventional chemical vapor deposition processes. The masking layer has a thickness is in the range of 2000 to 5000 angstroms, more preferably a thickness of about 3000 angstroms.

Masking stripes 52 with substantially vertical sidewalls 50 are formed in the masking layer using conventional photolithographic and anisotropic etching techniques. Generally, the width of the masking stripes corresponds to the distance between the bit lines to be formed. The masking stripe width 53 is in the range of 0.2 to 0.6 microns, more preferably about 0.4 microns. The spaces 54 between the masking stripes is greater than the width of the stripes 53. Preferably the masking stripes 52 are formed by anisotropic reactive ion etching.

Figure 5:
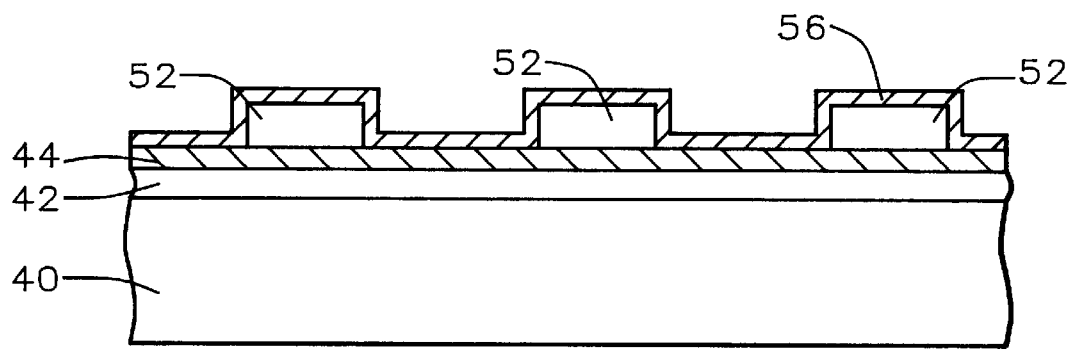
Figure 6:
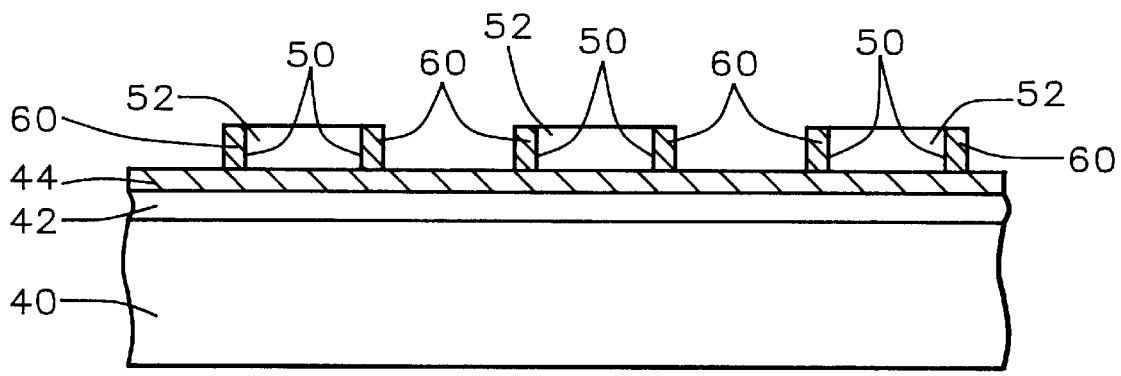
Figure 7:
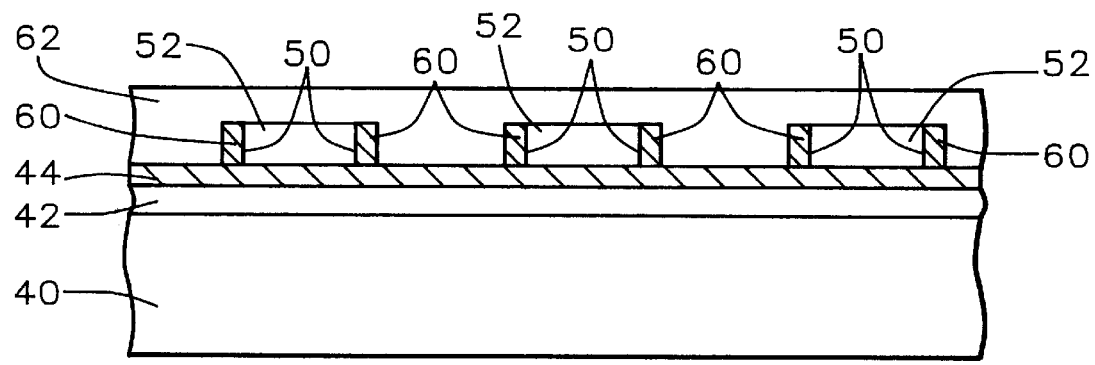
Figure 8:
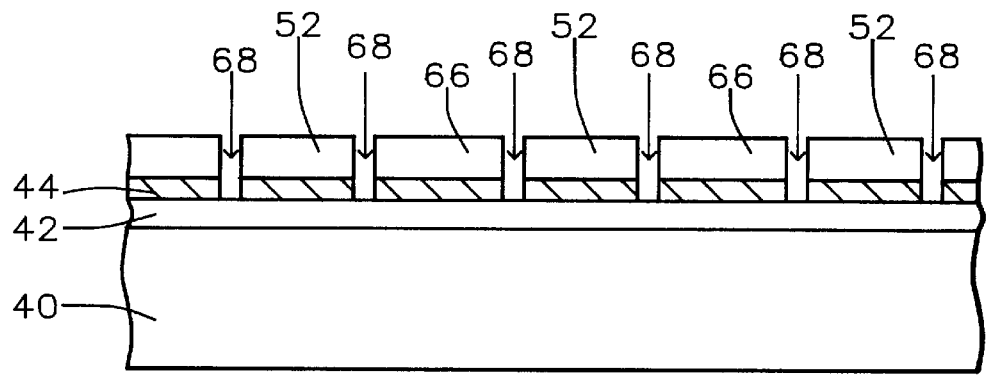
Figure 9:
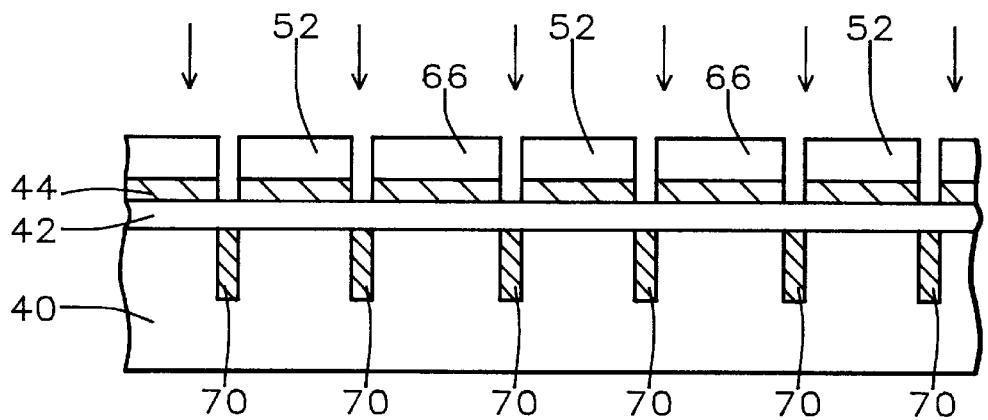

As shown in FIG. 5, a blanket conformal layer 56, preferably polycrystalline silicon is deposited over the masking stripes 52, masking stripe sidewalls 50, and the exposed areas 48 of the foundation layer 44. The conformal polycrystalline silicon layer 56 can be deposited by low pressure chemical vapor deposition at approximately 620° C. using $SiH_4$ source. The conformal layer 56 has a thickness in the range of 500 to 2000 angstroms, more preferably 1000 angstroms. The thickness of the conformal layer 56 determines the width of the buried bit lines. A characteristic of the conformal layer 56 is that it be preferentially etched with respect to the masking stripes when using anisotropic etching processes. The conformal layer 56 is anisotrophically etched to form spacers 60 on the vertical sidewalls 50 of the first masking layer. Preferably the conformal layer 56 is etched by a commercially available plasma dry etcher with significantly high polysilicon to silicon oxide selectivity and preferably higher than 20 to 1.

Subsequently, a planar glass layer 62 is deposited over the masking stripes 52 so to cover the masking stripes 52. Next, the glass layer 62 is planar etched to at least expose the top surfaces of the masking lines 52 and spacers 60. Glass Layer 62, a dielectric layer, such as borophososilicate glass (BPSG) can be formed by chemical vapor deposition (CVD) using a tetraethylorthosilicate (TEOS) as a reactant. Boron and phosphorus are added to the ambient during the formation of the borophososilicate glass layer. The layer 62 is thermally treated at a temperature of 850° C. for 30 minutes to cause flow and planarization.

Alternately, layer 62 can be formed using a spin on glass (SOG), preferably a siloxane, which is deposited, baked and cured at approximately 400° C. After the planarization process, a portion of layer 62 is etched until the top surfaces of the spacers 60 are exposed.

Following this, the spacers 60 and the foundation layer 44 underlying the spaces 60 are etched away to form narrow openings 68. The spacers 60 can be etched using a conventional isotropic etch with a high selectivity to oxide. The narrow openings 68 have a width in the range of 0.05 to 0.2 microns and preferably a width of approximately 0.1 microns. The spacing between the narrow openings 68 is in the range of 0.2 to 0.6 microns.

Impurity ions are implanted through the narrow openings 68 to form buried lines 70 in the substrate 40. The ion implant impurity can be any suitable impurity of a type opposite the impurity in the substrate 40. For a p type substrate suitable ions include arsenic or phosphorus ions. The ion implantation is typically achieved by implanting n-type ions, preferably arsenic or phosphorus ions, at a voltage in the range of 30 to 150 Kev and a dosage in the range of 1E14 to 1E16 atoms/$cm^2$. The buried bit lines are subsequently annealed. The buried bit lines 70 have a width in the range of 0.05 to 0.4 microns.

Figure 10:
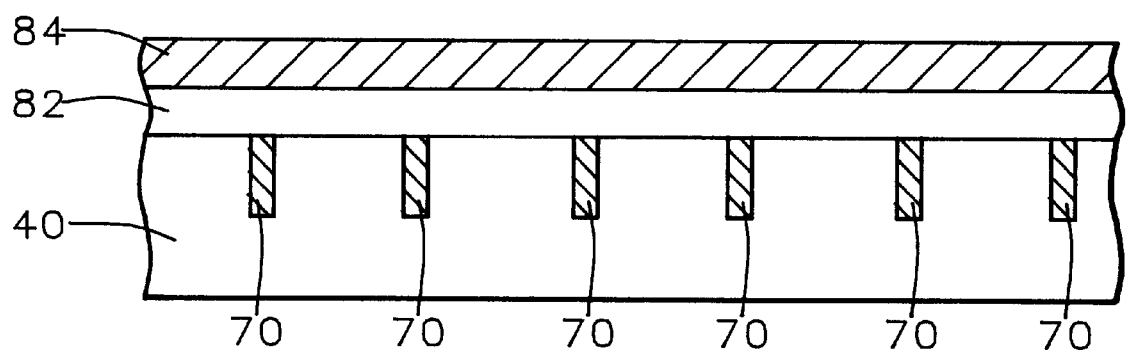

The layers 42, 44, and 52 are etched away leaving a substrate 40 with buried bit lines 70. As shown in FIG. 10, a thermal gate oxide layer is formed on the substrate 40. A doped polycrystalline silicon layer 84 is deposited over the gate oxide layer 82. The dopant, preferably is phosphorus in situ doped with a concentration in the range of about 1E18 to 1E21 atoms/$cm^3$. The dopant in layer 84 is combined in the reactants that are used to deposit the polysilicon material, as is well known. Also, polycrystalline silicon layer 84 can be ion implanted with phosphorus ions at a dose of 1E15 atoms/sq. cm. Word lines are formed from the polycrystalline silicon layer 84 by using conventional masking and etching techniques. The word lines can also be formed of a polycide material with a total thickness of less than 4000 angstroms. Finally, a non-volatile memory device can be formed using conventional semiconductor fabrication techniques.

Using the method of the invention, the bit line 70 width is determined by the thickness of the conformal layer 44. Bit line widths in the range of 0.05 to 0.2 microns are achievable. A preferable bit line width is approximately 0.1 micron. This compares with the conventional photolithographic process which typically achieves a minimum 0.5 micron bit line width.

While the invention has been particularly shown and described with reference to the preferred embodiments thereof, it will be understood by those skilled in the art that various changes in form and details may be made without departing from the spirit and scope of the invention.

What is claimed is:

1. A method of forming a plurality of self-aligned closely spaced very narrow buried bit lines in a semiconductor substrate, comprising the steps of:

providing a thin insulating layer on the surface of the semiconductor substrate, depositing a foundation layer over the thin insulating layer, depositing a blanket first masking layer over the foundation layer, depositing a photoresist layer over the first masking layer, exposing and developing the photoresist layer to define a pattern of elongated spaced parallel lines, anisotropically etching the exposed first masking layer through the photoresist pattern to form masking stripes having vertical sidewalls and exposing areas of the foundation layer, removing the photoresist pattern, depositing a polysilicon conformal layer over the first masking layer and exposed areas of the foundation layer, anisotropically etching the polysilicon conformal layer to form polysilicon spacers on the vertical sidewalls of the first masking layer, depositing and planarizing a glass layer over the line pattern to thickness greater than the thickness of the masking stripes, planar etching the glass layer to expose the top surfaces of the masking stripes and spacers, preferentially etching the spacers and etching through the underlying foundation layer forming narrow openings, implanting impurity ions into said substrate through the openings to form buried bit lines, removing the masking stripes of the first masking layer and the glass layer, removing the thin insulating layer and the foundation layers, forming a thermal gate oxide layer on the substrate surface, depositing a polycrystalline silicon layer over the gate oxide layer, forming a mask by photolithography and using the mask to etch the polycrystalline silicon layer thereby forming spaced parallel, conductive word lines from said polycrystalline silicon layer that are orthogonal to said buried bit lines.

2. The method of claim 1 wherein said thin insulating layer is silicon oxide having a thickness in the range of 50 to 400 angstroms.

3. The method of claim 1 wherein the foundation layer is formed of polycrystalline silicon material.

4. The method of claim 1 wherein the foundation layer is formed of silicon nitride material.

5. The method of claim 1 wherein the foundation layer has a thickness in the range of 100 to 1000 angstroms.

6. The method of claim 1 wherein the blanket masking layer is silicon oxide deposited by a chemical vapor deposition technique.

7. The method of claim 6 wherein the blanket masking layer thickness has a range of 2000 to 5000 angstroms.

8. The method of claim 1 wherein the elongated spaced parallel line pattern in the photoresist has a stripe width in the range of 0.2 to 0.6 microns.

9. The method of claim 1 wherein the conformal layer is polycrystalline silicon and is formed by low pressure chemical vapor deposition at approximately 620° C. using $SiH_4$ source.

10. The method of claim 9 wherein conformal layer has a thickness in the range of 500 to 2000 angstroms.

11. The method of claim 1 wherein the planar glass layer is formed of borophosphosilicate glass.

12. The method of claim 1 wherein the planar glass layer deposited over the line pattern has a thickness of 2000 to 10,000 angstroms.

13. The method of claim 1 wherein the preferentially etching the polycrystalline silicon spacers is achieved by wet or dry etching with a high selectivity to oxide.

14. The method of claim 1 wherein the impurity ions implanted into the substrate are arsenic ions.

15. The method of claim 1 wherein the ion implant energy is in the range of 30 to 150 Kev and the dosage is in the range of 1E14 to 1E16 atoms/cm$^2$.

16. The method of claim 1 wherein the width of the narrow openings is on the order of 0.05 to 0.2 microns.

17. The method of claim 1 wherein the spacing between the narrow openings is in the range of 0.2 to 0.6 microns.

18. A method of forming a plurality of self-aligned closely spaced very narrow buried conductive lines in a semiconductor substrate, comprising the steps of:

providing a thin insulating layer on the surface of the semiconductor substrate, forming masking stripes having vertical sidewalls over the thin insulating layer, forming polysilicon spacers on the vertical sidewalls of the masking stripes, forming a glass layer between the spacers, preferentially etching the polysilicon spacers forming narrow openings between the masking lines and the glass layer, and implanting impurity ions into said substrate through the narrow openings to form conductive buried lines.

19. The method of claim 18 wherein the polysilicon spacers are formed by:

depositing a conformal layer over the masking stripes and exposed areas of the insulating layer, and anisotropically etching the conformal layer to form said spacers on the vertical sidewall of the first masking stripes.

20. The method of claim 18 wherein spacers have a thickness in the range of 500 to 2000 angstroms.

21. The method of claim 18 wherein the ions implanted into the substrate are arsenic ions.

22. The method of claim 18 wherein the ion implant energy is in the range of 30 to 150 Kev and the dosage is in the range of 1E14 to 1E16 atoms/cm$^2$.

23. The method of claim 18 wherein the width of the narrow openings is on the order of 0.05 to 0.2 microns.

24. The method of claim 18 wherein the spacing between the narrow openings is in the range of 0.2 to 0.6 microns.

25. The method of claim 18 wherein the width of the buried conductive line is in the range of 0.05 to 0.4 microns.

* * * * *